(12) United States Patent
Shibata et al.

(10) Patent No.: US 8,454,754 B2
(45) Date of Patent: Jun. 4, 2013

(54) CLEANING METHOD AND METHOD FOR MANUFACTURING ELECTRONIC DEVICE

(75) Inventors: Yukihiro Shibata, Fukuoka-ken (JP); Naoya Hayamizu, Kanagawa-ken (JP); Masaaki Kato, Okayama-ken (JP); Nobuo Kobayashi, Kanagawa-ken (JP)

(73) Assignees: Shibaura Mechatronics Corporation, Yokohama-shi (JP); Chlorine Engineers Corp. Ltd., Tokyo (JP); Kabushiki Kaisha Toshiba, Tokyo (JP)

( * ) Notice: Subject to any disclaimer, the term of this patent is extended or adjusted under 35 U.S.C. 154(b) by 705 days.

(21) Appl. No.: 12/028,288

(22) Filed: Feb. 8, 2008

(65) Prior Publication Data

US 2008/0196743 A1 Aug. 21, 2008

(30) Foreign Application Priority Data

Feb. 9, 2007 (JP) ................... 2007-031286

(51) Int. Cl.
*B08B 3/10* (2006.01)
(52) U.S. Cl.
USPC .......... 134/19; 134/2; 134/3; 134/33
(58) Field of Classification Search
None
See application file for complete search history.

(56) References Cited

U.S. PATENT DOCUMENTS

| | | | |
|---|---|---|---|
| 5,651,860 A * | 7/1997 | Li | 438/705 |
| 2005/0139487 A1 | 6/2005 | Zwicker et al. | |
| 2008/0251108 A1* | 10/2008 | Nagai et al. | 134/56 R |

FOREIGN PATENT DOCUMENTS

| | | | |
|---|---|---|---|
| JP | 11-293288 | * | 10/1999 |
| JP | 2005-183937 | | 7/2005 |
| JP | 2006-108304 | | 4/2006 |
| JP | 2006-111943 | | 4/2006 |
| JP | 2006-114880 | | 4/2006 |
| TW | 200610841 | | 4/2006 |
| WO | WO 2006/030816 A1 | | 3/2006 |

OTHER PUBLICATIONS

Machine Translation of JP 11-293288 by Morita et al., published Oct. 26, 1999.*
Chinese Office Action, dated Aug. 4, 2010, with english translation, submitted by applicant in an IDS filed Sep. 22, 2010.*
Office Action issued Aug. 18, 2011 in Taiwan Application No. 097104727 (With English Translation).
Japanese Office Action issued Sep. 7, 2011, in Patent Application No. 2007-031286 (with English-language translation).
Office Action issued Mar. 23, 2012, in Japanese Patent Application No. 2007-031286 with English translation.
Combined Chinese Office Action and Search Report issued Oct. 31, 2012 in Patent Application No. 201110066173.X with English Translation.

* cited by examiner

*Primary Examiner* — Michael Kornakov
*Assistant Examiner* — Ryan Coleman
(74) *Attorney, Agent, or Firm* — Oblon, Spivak, McClelland, Maier & Neustadt, L.L.P.

(57) ABSTRACT

A cleaning method includes: producing an oxidizing solution by electrolysis of sulfuric acid; and cleaning a workpiece with the oxidizing solution. The oxidizing solution is heated by heat of mixing to clean the workpiece. A method for manufacturing an electronic device includes: producing a workpiece; producing an oxidizing solution by electrolysis of sulfuric acid; and cleaning the workpiece with the oxidizing solution. The oxidizing solution is heated by heat of mixing to clean the workpiece.

17 Claims, 15 Drawing Sheets

MAX TEMPERATURE(°C)　　(PEELABLE TIME)

| | HYDROGEN PEROXIDE SOLUTION (RT) | | | |
|---|---|---|---|---|
| ELECTROLYZED SULFURIC ACID (RT) | 1 | 2 | 3 | 5 |
| 1 | 115(5sec) | 125(5sec) | 130(5sec) | 110(5sec) |
| 2 | 95(5sec) | | | |
| 3 | 80(5sec) | | | |
| 5 | 80(5sec) | | | |

FIG. 4

INCREASED MAX TEMPERATURE(°C) (PEELING TIME)

| ELECTROLYZED SULFURIC ACID (RT) | $H_2O_2$ | | | |
|---|---|---|---|---|
| 1 | 1 | 2 | 3 | 5 |
| | 115(30) | 125(5) | 130(1) | 110(50) |
| 1 | $H_2O$ | | | |
| | 115(30) | 95(×) | 80(×) | 80(×) |

FIG. 5

MAX TEMPERATURE(°C)    (PEELABLE TIME)

| ELECTROLYZED SULFURIC ACID (RT) | HYDROGEN PEROXIDE SOLUTION (RT) | | | |
|---|---|---|---|---|
| | 1 | 2 | 3 | 5 |
| 1 | 115(30sec) | 125(5sec) | 130(1sec) | 110(50sec) |
| 2 | 95(65sec) | | | |
| 3 | 80(65sec) | | | |
| 5 | 80(65sec) | | | |

FIG. 6

INCREASED MAX TEMPERATURE (°C) FOR EACH MIXING RATIO PEELABLE TIME

|  | PURE WATER | | | |
|---|---|---|---|---|
| ELECTROLYZED SULFURIC ACID (RT) | 1 | 2 | 3 | 5 |
| 1 | 95(5sec) | 87(5sec) | 64(5sec) | 60(5sec) |
| 2 | 96(5sec) | | | |
| 3 | 94(5sec) | | | |
| 5 | 75(5sec) | | | |

FIG. 11

INCREASED MAX TEMPERATURE(°C) (PEELING TIME)

| ELECTROLYZED SULFURIC ACID (RT) | $H_2O_2$ | | | |
|---|---|---|---|---|
| 1 | 1 | 2 | 3 | 5 |
| | 95(30) | 96(60) | 94(90) | 75(×) |
| 1 | $H_2O$ | | | |
| | 95(60) | 87(×) | 64(×) | 60(×) |

FIG. 12

CLEANING METHOD AND METHOD FOR MANUFACTURING ELECTRONIC DEVICE

CROSS-REFERENCE TO RELATED APPLICATIONS

This application is based upon and claims the benefit of priority from the prior Japanese Patent Application No. 2007-031286, filed on Feb. 9, 2007; the entire contents of which are incorporated herein by reference.

BACKGROUND OF THE INVENTION

1. Field of the Invention

This invention relates to a cleaning method and a method for manufacturing an electronic device, and more particularly to a cleaning method and a method for manufacturing an electronic device using oxidizing substances produced by electrolyzing sulfuric acid.

2. Background Art

Conventionally, organic materials, metal impurities, particles, dry etching residues, and unwanted metals attached to liquid crystal display panel or plasma display panel (PDP) substrates and semiconductor wafers are removed by SPM cleaning, which uses a mixed liquid of sulfuric acid and hydrogen peroxide solution at high temperature, or by a cleaning process based on polymer removers composed primarily of organic amines.

In contrast, JP-A 2006-111943 (Kokai) discloses a cleaning technique using persulfate ions produced by electrolyzing sulfuric acid solution.

With the recent trend toward smaller devices, a high-dose ion implantation process is often needed for realizing high-speed operation. However, the mask made of resist or other organic matter used in the high-dose ion implantation process has a problem of being difficult to remove after the implantation process. Thus a cleaning method having higher cleaning performance or organic removal performance is required.

SUMMARY OF THE INVENTION

According to an aspect of the invention, there is provided a cleaning method including: producing an oxidizing solution by electrolysis of sulfuric acid; and cleaning a workpiece with the oxidizing solution which is heated by heat of mixing.

According to another aspect of the invention, there is provided a method for manufacturing an electronic device, including: forming a workpiece; producing an oxidizing solution by electrolysis of sulfuric acid; and cleaning the workpiece with the oxidizing solution which is heated by heat of mixing.

BRIEF DESCRIPTION OF THE DRAWINGS

FIG. 4 shows a table summarizing the result for the evaluation sample A simply coated with resist.

FIG. 5 shows a table of the result for the evaluation sample B in which the applied resist is ion-implanted with the above amount of boron.

FIG. 6 shows a table summarizing the result of more detailed investigations on the case of adding hydrogen peroxide solution.

FIG. 11 shows a table summarizing the result of cleaning the evaluation sample A simply coated with resist in this embodiment.

FIG. 12 shows a table of the result for the evaluation sample B in which the applied resist is ion-implanted with the above amount of boron.

DETAILED DESCRIPTION OF THE INVENTION

Embodiments of the invention will now be described with reference to the drawings.

Figure 1:
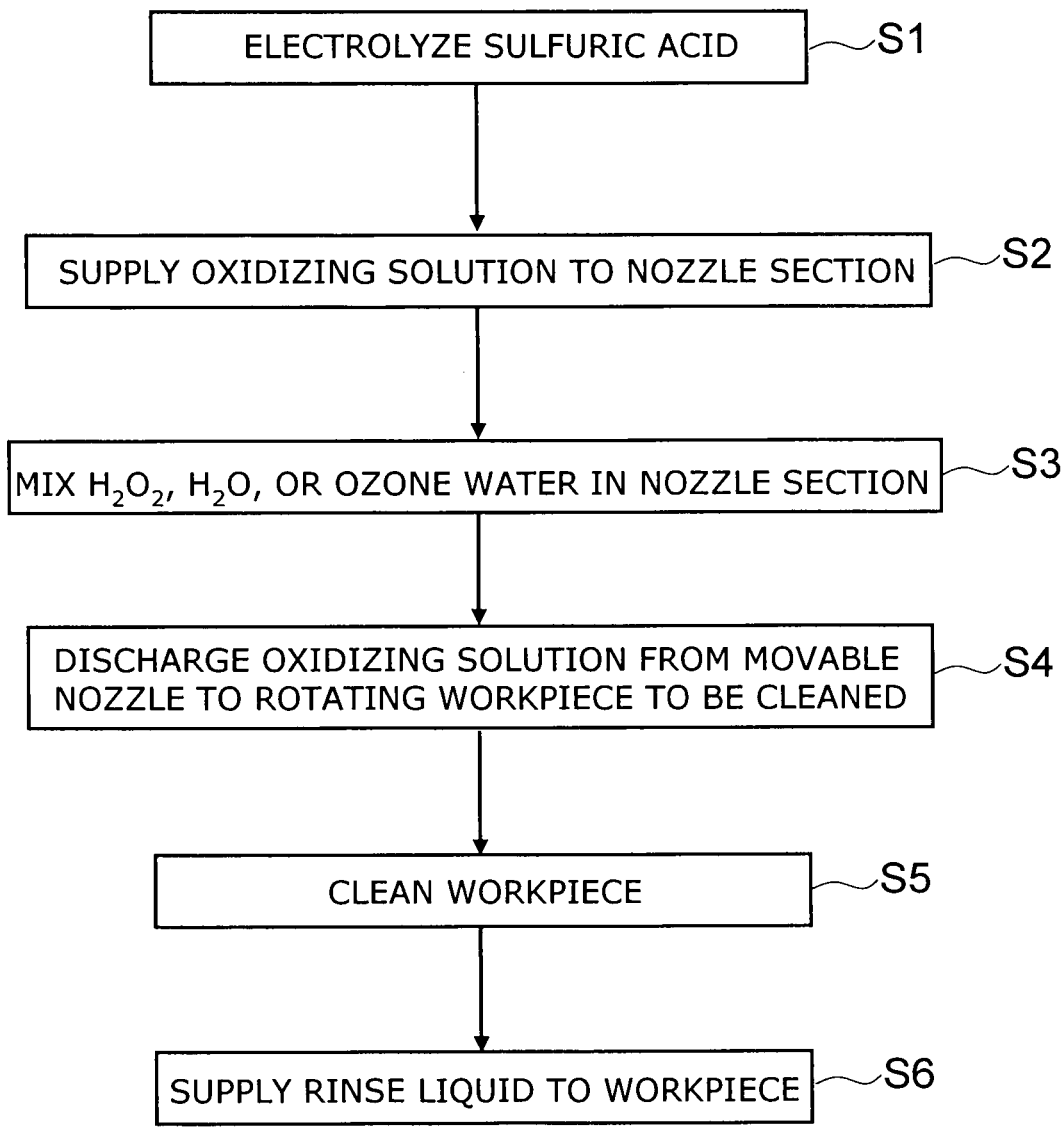
FIG. 1 is a flow chart illustrating a cleaning method according to a first embodiment of the invention.

FIG. 1 is a flow chart illustrating a cleaning method according to a first embodiment of the invention.

More specifically, the cleaning method of this embodiment comprises the steps of obtaining an oxidizing solution by electrolyzing concentrated sulfuric acid (step S1), supplying the oxidizing solution to a nozzle section (step S2), mixing hydrogen peroxide solution ($H_2O_2$), pure water ($H_2O$), or ozone water ($O_3+H_2O$) into the oxidizing solution (step S3), discharging the cleaning liquid from a movable nozzle to a rotating workpiece to be cleaned (step S4), cleaning the workpiece (step S5), and rinsing the workpiece (step S6).

Figure 2:
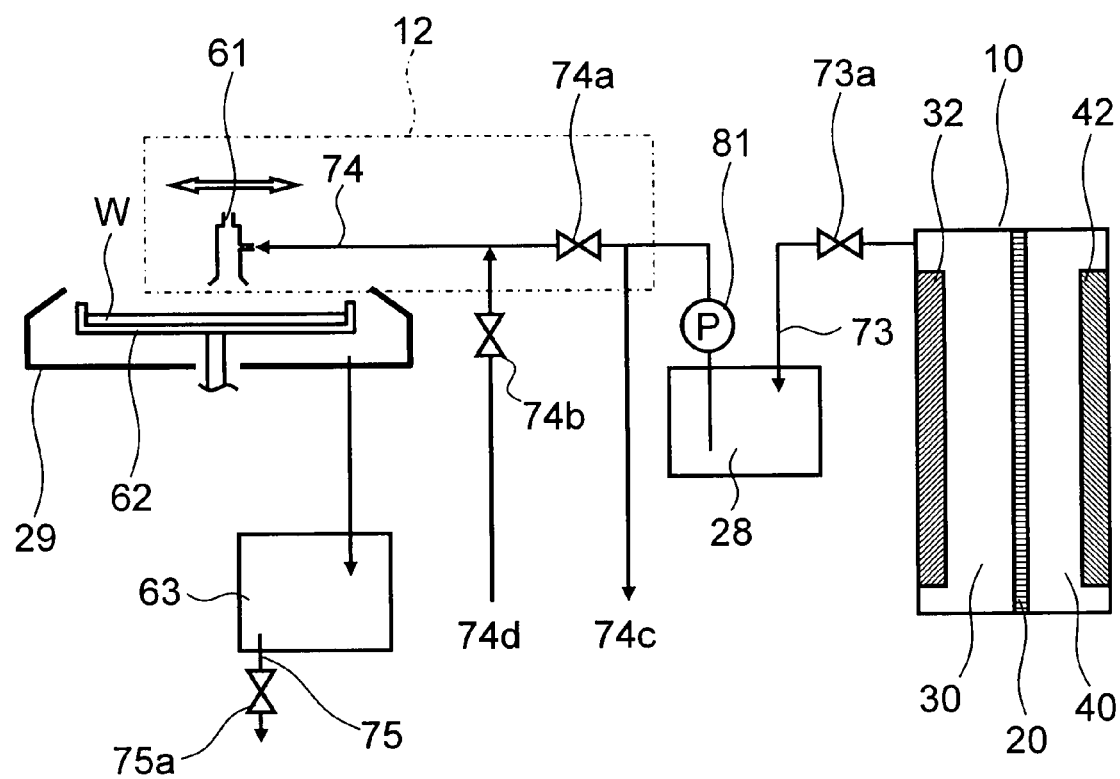
FIG. 2 is a schematic view illustrating a cleaning system that can perform the cleaning method of this embodiment.

FIG. 2 is a schematic view illustrating a cleaning system that can perform the cleaning method of this embodiment.

In step S1, an oxidizing solution is produced by electrolyzing concentrated sulfuric acid in a sulfuric acid electrolysis section 10. The sulfuric acid electrolysis section 10 comprises an anode 32, a cathode 42, a diaphragm 20 provided between the anode 32 and the cathode 42, an anode chamber 30 defined between the anode 32 and the diaphragm 20, and a cathode chamber 40 defined between the cathode 42 and the diaphragm 20.

The electrolyzed sulfuric acid produced by electrolyzing concentrated sulfuric acid is an oxidizing solution containing oxidizing substances. In step S2, this oxidizing solution is stored in a tank 28 through a pipeline 73 having an open/close valve 73a, and supplied to a nozzle 61 through a pipeline 74 by the action of a pump 81. The amount supplied to the nozzle 61 is regulated by flow rate regulation by an open/close valve 74a and flow rate regulation by ejection to an ejection line 74c provided between the open/close valve 74a and the pump 81. Furthermore, the quantitative variation of the oxidizing solution produced in the sulfuric acid electrolysis section 10 can be buffered by storing the oxidizing solution in the tank 28. The tank 28 can be provided with a heater, in which case the oxidizing solution can be temperature-controlled. For example, a higher cleaning performance can be obtained by heating the oxidizing solution in the tank 28 to a temperature of approximately 80° C.

By electrolyzing sulfuric acid in the sulfuric acid electrolysis section 10, oxidizing substances having high oxidizability such as peroxomonosulfuric acid ($H_2SO_5$) and peroxodisulfuric acid ($H_2S_2O_8$) are produced as reaction products. The oxidizability of these oxidizing substances is decreased by water. In particular, peroxomonosulfuric acid, which is effective for peeling/removing organic matter, is decomposed by reaction with water. However, by supplying the anode chamber 30 with concentrated sulfuric acid of 90 mass percent or more, and more preferably 96 mass percent or more, oxidizing substances are allowed to exist in a state with minimum water. This enables quantitative and extensive supply of peroxomonosulfuric acid. Thus, for example, the efficiency of removing resists and contaminants can be improved, and the productivity can be increased.

The anode 32 of the sulfuric acid electrolysis section can be made of an insoluble anode (DSA), platinum, lead dioxide, or conductive diamond. The electrolyzed sulfuric acid produced by electrolysis in the sulfuric acid electrolysis section is directly applied to a workpiece to be cleaned such as a resist-coated silicon wafer, which requires high cleanliness. Hence, as the anode 32, it is preferable to use one of an insoluble anode (DSA), platinum, and conductive diamond, which exhibit low elution of impurities. In particular, for realizing high oxygen overvoltage, it is more preferable to use conductive diamond, which has a high capacity of producing oxidizing substances having high oxidizability such as peroxomonosulfuric acid and peroxodisulfuric acid.

On the other hand, the cathode 42 can be made of an insoluble anode (DSA), platinum, carbon, or conductive diamond.

As described later in detail, the cleaning process and the process for removing resist or other organic matter using electrolyzed sulfuric acid are highly dependent on the processing temperature, and it is preferable that the process be performed on heating. Hence, in step S3, at least one of hydrogen peroxide solution ($H_2O_2$), pure water ($H_2O$), and ozone water ($O_3+H_2O$) is mixed into the electrolyzed sulfuric acid serving as the oxidizing solution. That is, in this embodiment, before the oxidizing solution is brought into contact with a workpiece to be cleaned W, hydrogen peroxide solution, pure water, or ozone water is mixed therein. The effect of heat of dilution or heat of reaction due to mixing increases the temperature of the electrolyzed sulfuric acid serving as the oxidizing solution. This mixing is performed in the nozzle section 12.

The supply of hydrogen peroxide solution, pure water, or ozone water is performed through a pipeline 74d and an open/close valve 74b.

In step S4, the oxidizing solution mixed in step S3 is discharged from the nozzle 61 to the workpiece W. The nozzle 61 is movable so that the oxidizing solution uniformly covers the workpiece W. Furthermore, the workpiece W is mounted and rotated on a rotary table 62 provided in the cover 29. Motion of the nozzle 61 and rotation of the workpiece W allow the oxidizing solution to uniformly cover the workpiece.

Figure 3:
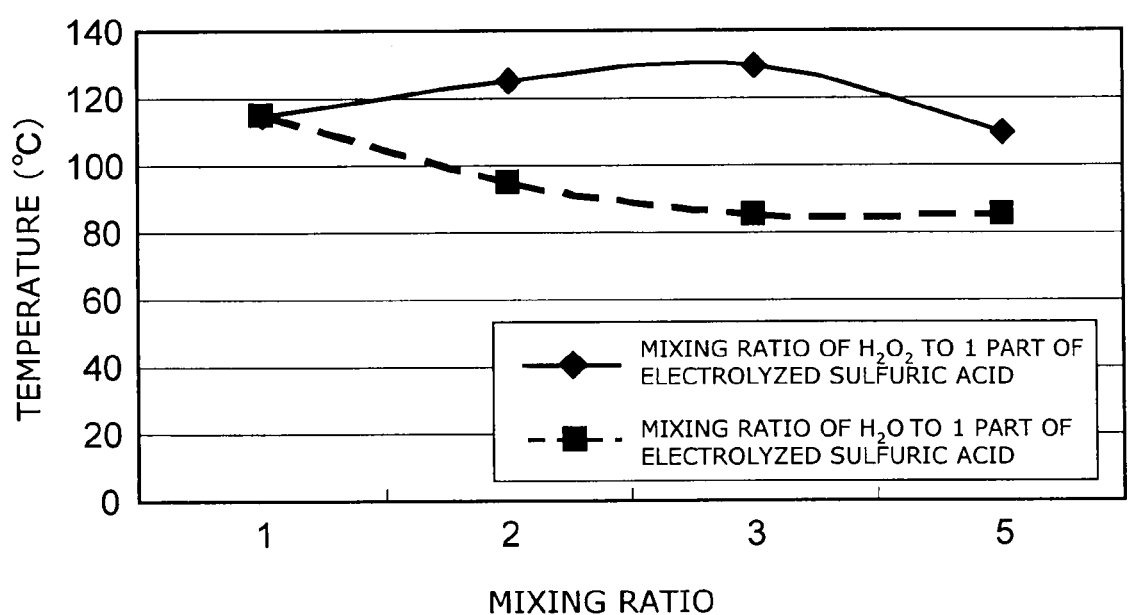
FIG. 3 is a graph showing temperature variation versus mixing ratio for the mixed solution of the oxidizing solution mixed with hydrogen peroxide solution or pure water in the nozzle section 12.

FIG. 3 is a graph showing temperature variation versus mixing ratio for the mixed solution of the oxidizing solution mixed with hydrogen peroxide solution or pure water in the nozzle section 12.

Here, the cleaning experiment was performed with the temperature of the oxidizing solution before mixing being set to room temperature. This oxidizing solution was mixed with hydrogen peroxide solution or pure water in the nozzle section 12 of the system shown in FIG. 2 and dripped onto a wafer W. The temperature was measured by laser irradiation of the oxidizing solution dripped from the nozzle 61 onto the wafer.

When pure water was mixed with a mixing ratio (volume ratio) of 1 part thereof to 1 part of the oxidizing solution, the temperature increased to approximately 115° C. by heat of mixing (heat of dilution) as shown in FIG. 3. When the mixing ratio of pure water was increased to 2, 3, and 5, the temperature of the oxidizing solution exhibited a tendency of gradually decreasing from 95° C. to 80° C.

On the other hand, when hydrogen peroxide solution (35 percent concentration) was mixed, the temperature was approximately 115° C. due to heat of mixing (heat of reaction) for a mixing ratio (volume ratio) of 1. When the mixing ratio was increased to 2 and 3, the temperature increased to 125° C. and 130° C., and when the mixing ratio was increased to 5, the temperature decreased to 110° C. Thus it turns out that the temperature increase by mixing pure water is larger than that by mixing hydrogen peroxide solution. As described later in detail, a favorable cleaning result was obtained under the condition that hydrogen peroxide solution was mixed with a mixed ratio of 3.

Returning to FIG. 1, in step S5, organic materials or other contaminants on the workpiece W are peeled/removed by the oxidizability of the oxidizing solution. The peeled/removed contaminants are turned into a solution or semi-solution state, shattered by the centrifugal force from the rotating workpiece W, and adhered to the inner surface of the cover 29. The rotation speed of the rotary table 62 affects the peeling of the contaminants. Hence, cleaning can be efficiently performed by optimizing the rotation speed in accordance with the contamination situation.

In step S6, a rinse liquid is discharged from a nozzle, not shown, to the surface of the workpiece W, which is thereby rinsed.

The oxidizing solution and contaminants ejected out of the cover 29 are ejected out of the system through a recovery tank 63, an ejection pipeline 75, and an ejection valve 75a.

Next, a description is given of the result of investigating the cleaning effect using evaluation samples in this embodiment where hydrogen peroxide solution or pure water is mixed in the oxidizing solution obtained by electrolyzing concentrated sulfuric acid.

Samples A and B were used as the evaluation samples to be cleaned. The sample A was prepared by simply coating a silicon substrate with i-line resist to 3 microns. The sample B was, after this resist coating, doped with boron at a dose amount of $6 \times 10^{14}/cm^2$ by ion implantation. With regard to the processing method, an oxidizing solution obtained by electrolyzing concentrated sulfuric acid is mixed with hydrogen peroxide solution or pure water in the nozzle section 12 of the system shown in FIG. 2, and dripped onto the wafer.

The determination as to whether the resist is successfully peeled by cleaning was made by surface observation using an optical microscope, evaluation using a particle counter, surface observation by SEM (scanning electron microscopy), and EDX (energy dispersive X-ray fluorescence spectrometry).

First, a description is given of the result of mixing hydrogen peroxide solution in the oxidizing solution and using it to clean the evaluation sample A simply coated with resist.

FIG. 4 shows a table summarizing the result for the evaluation sample A simply coated with resist.

The table shows the maximum temperature (° C.) of the solution due to heat of mixing (heat of reaction) upon mixing hydrogen peroxide solution at room temperature in the oxidizing solution at room temperature. The time taken to peel the applied resist at that temperature is parenthesized. When the mixing ratio (volume ratio) of hydrogen peroxide solution to 1 part of the oxidizing solution at room temperature was increased to 1, 2, 3, and 5, the maximum temperature was 115° C., 125° C., 130° C., and 110° C. as also shown in FIG. 3. On the other hand, when the mixing ratio (volume ratio) of the oxidizing solution to 1 volume of hydrogen peroxide solution was increased to 1, 2, 3, and 5, the maximum temperature changed to 115° C., 95° C., 80° C., and 80° C. In both cases, the time taken to peel the resist was 5 seconds.

That is, it turns out that high cleanability is achieved under any of the conditions for the sample A simply coated with resist. Furthermore, it turns out that high temperatures above 100° C. are obtained when the mixing ratio of the oxidizing solution to hydrogen peroxide solution is in the range of 1:1 to 1:5, and that high temperatures above 120° C. are obtained when the mixing ratio is in the range of 1:2 to 1:3.

FIG. 5 shows a table of the result for the evaluation sample B in which the applied resist is ion-implanted with the above amount of boron. In general, a resist becomes resistant to peeling by ion implantation. As seen from FIG. 5, when pure water was mixed, the maximum temperature was 115° C. for a mixing ratio of 1:1, and the time for peeling the resist in this case was 30 seconds. When the volume ratio of pure water was increased to 2, 3, and 5, the maximum temperature successively decreases as also shown in FIG. 3, and the resist was difficult to peel under any of these conditions.

On the other hand, when hydrogen peroxide solution (35 percent concentration) was mixed with its volume ratio to 1 volume of the oxidizing solution being 1, 2, 3, and 5, the maximum temperature was 115° C., 125° C., 130° C., and 110° C. as also shown in FIG. 3, and the time taken to peel the resist was 30, 5, 1, and 50 seconds. That is, in every case, the ion-implanted resist was successfully peeled. In particular, when the maximum temperature was 125° C. or higher, the peeling time was 5 seconds or less, indicating the achievement of very strong cleanability.

FIG. 6 shows a table summarizing the result of more detailed investigations on the case of adding hydrogen peroxide solution.

Here, the result for the case where the volume of hydrogen peroxide solution was increased to 1, 2, 3, and 5 for 1 volume of the oxidizing solution is the same as that described above with reference to FIG. 5. On the other hand, when the volume of the oxidizing solution was increased to 1, 2, 3, and 5 for 1 volume of hydrogen peroxide solution being mixed, the maximum temperature successively decreases to 115° C., 95° C., 80° C., and 80° C., and the time for peeling the ion-implanted resist lengthened to 30, 65, 65, and 65 seconds. That is, it turns out that the cleanability successively decreases with the decrease of temperature.

In comparison with the case of mixing pure water described above with reference to FIG. 5, under the condition that the maximum temperature is 95° C. or 80° C., resist peeling is difficult when pure water is mixed, but resist peeling is possible when hydrogen peroxide solution is mixed (FIG. 6). This is presumably because of the effect of increased temperature due to mixing of hydrogen peroxide solution, and additionally because sulfuric acid reacts with hydrogen peroxide solution to increase oxidizing substances having high oxidizability such as peroxomonosulfuric acid ($H_2SO_5$).

Figure 7:
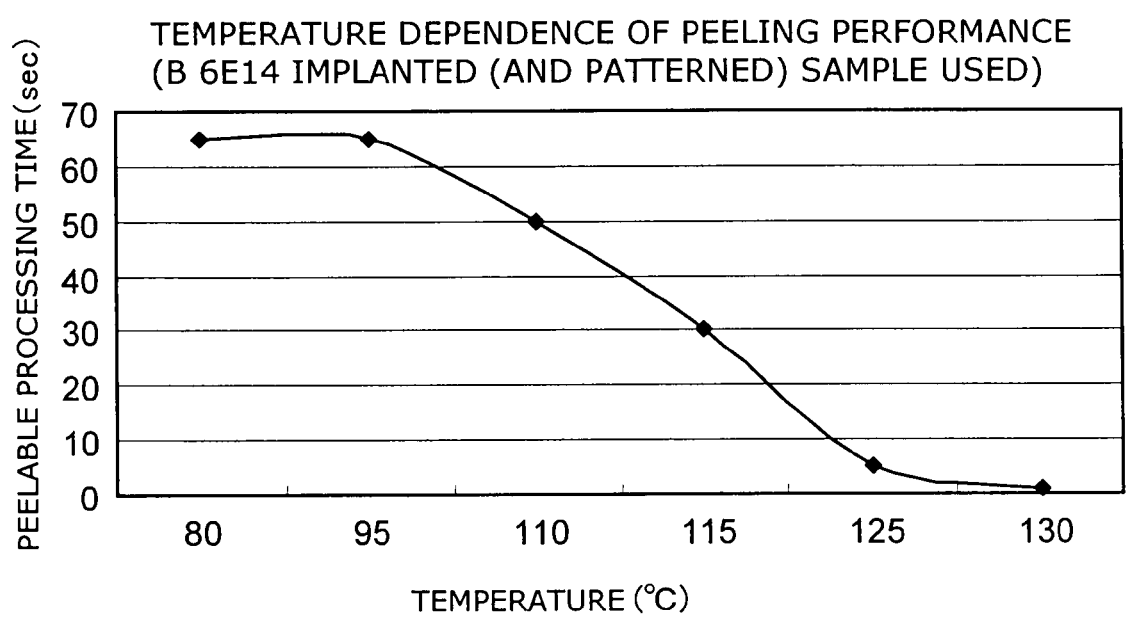
FIG. 7 is a graph summarizing the relationship between the temperature of the oxidizing solution mixed with hydrogen peroxide solution and the time taken for peeling, with regard to the evaluation sample B in which the resist is ion-implanted with boron.

FIG. 7 is a graph summarizing the relationship between the temperature of the oxidizing solution mixed with hydrogen peroxide solution and the time taken for peeling, with regard to the evaluation sample B in which the resist is ion-implanted with boron.

The time taken to peel the resist significantly depends on the temperature of the oxidizing solution. Above 95° C., the peeling time decreases, starting to affect the cleanability. When the maximum temperature reaches 125° C., the time taken for peeling decreases to 5 seconds, which is nearly the shortest time.

As seen from the foregoing results, in order to improve the cleanability of the oxidizing solution obtained by electrolyzing concentrated sulfuric acid, it is preferable to mix hydrogen peroxide solution so that the temperature increases to 95° C. or higher. Furthermore, a sufficiently high cleanability is achieved by mixing hydrogen peroxide solution so that the temperature increases to 125° C. or higher.

Next, a second embodiment of the invention is described.

Figure 8:
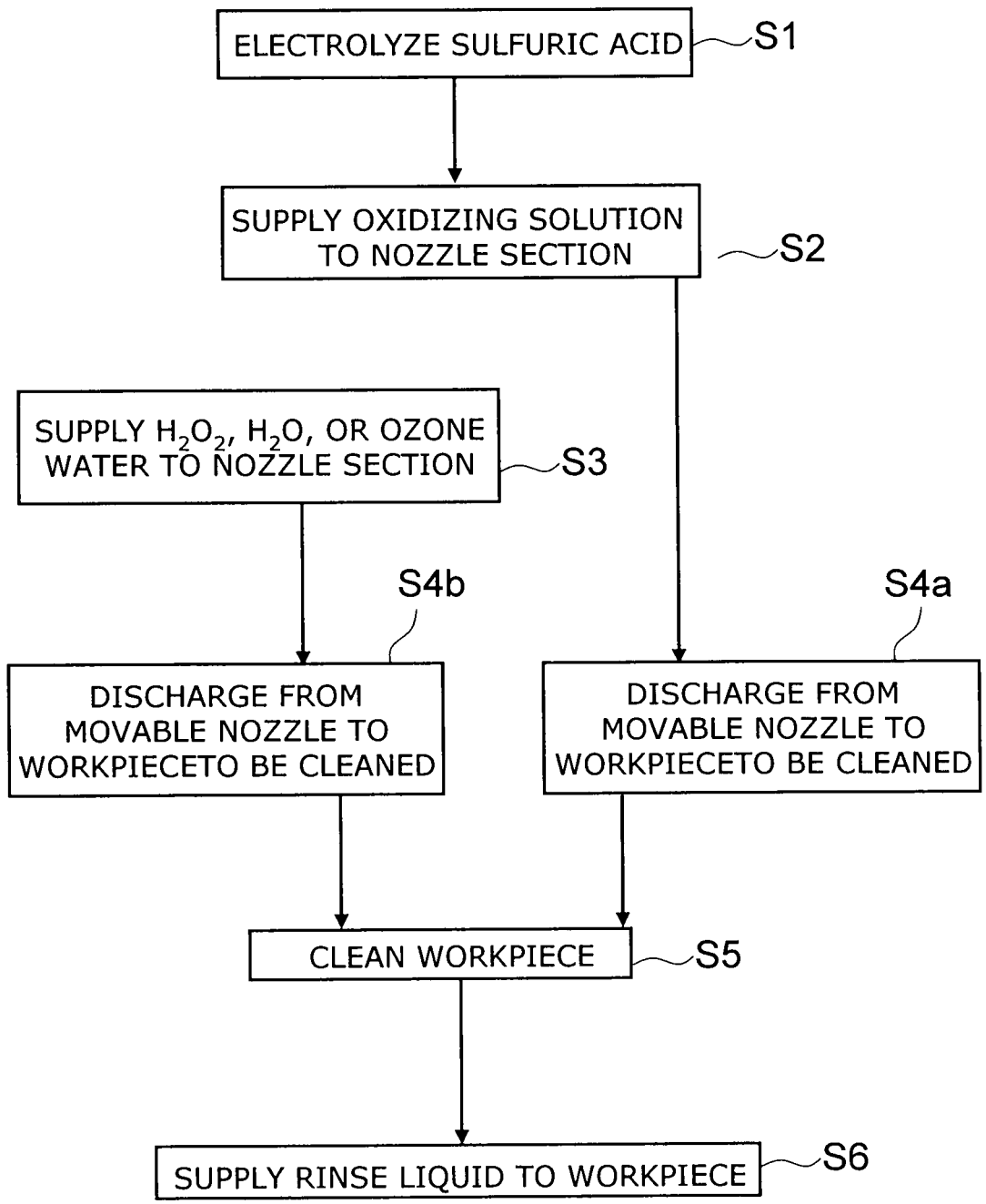
FIG. 8 is a flow chart illustrating a cleaning process in a cleaning method according to a second embodiment of the invention.

FIG. 8 is a flow chart illustrating a cleaning process in a cleaning method according to the second embodiment of the invention.

Figure 9:
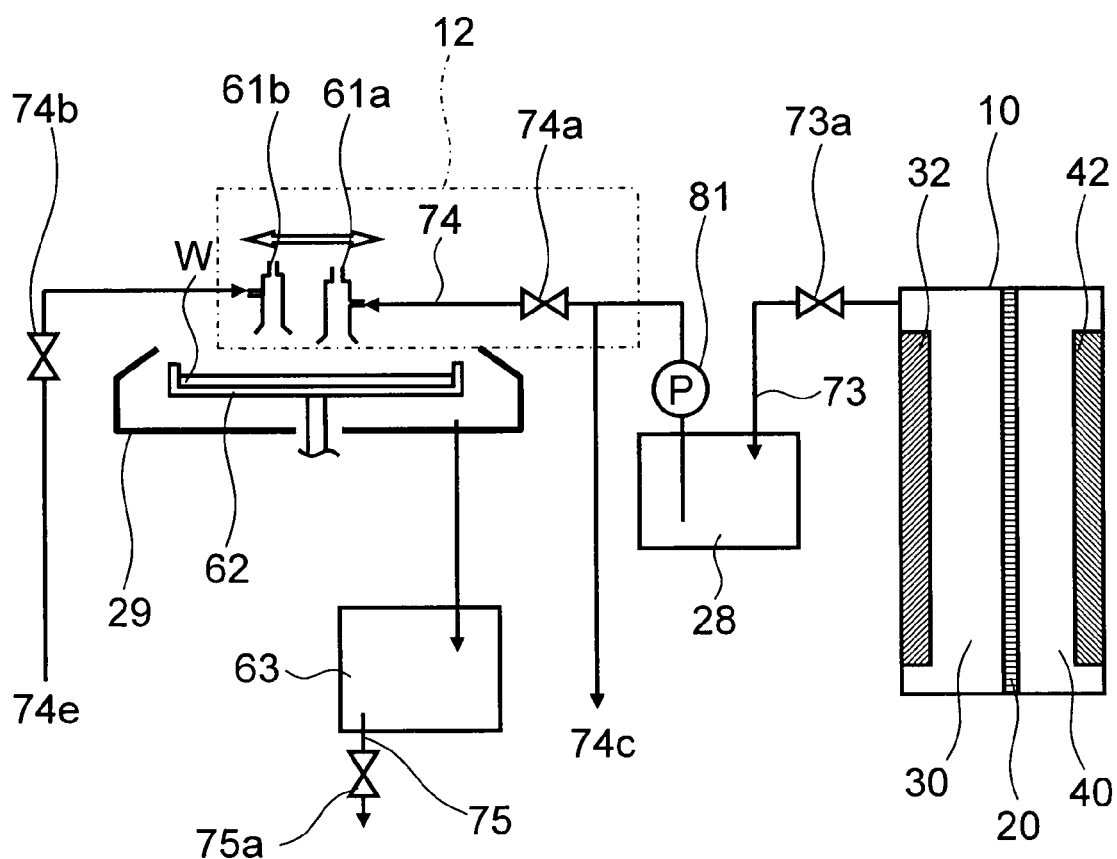
FIG. 9 is a schematic view illustrating a cleaning system that can be used in this embodiment.

FIG. 9 is a schematic view illustrating a cleaning system that can be used in this embodiment.

In this embodiment, mixing of the oxidizing solution with hydrogen peroxide solution, pure water, or ozone water is performed on the workpiece to be cleaned.

Steps S1 and S2 are the same as those in the first embodiment. However, in step S3, hydrogen peroxide solution, pure water, or ozone water is supplied to the nozzle section 12 independently of the oxidizing solution produced in the sulfuric acid electrolysis section 10 and supplied.

Hydrogen peroxide solution, pure water, or ozone water is supplied to a nozzle 61b through a pipeline 74e and an open/close valve 74b.

In step S4a, the oxidizing solution is discharged from a nozzle 61a onto the workpiece W. In step S4b, at least one of hydrogen peroxide solution, pure water, and ozone water is discharged from the nozzle 61b onto the workpiece W. That is, in this embodiment, after the oxidizing solution is brought into contact with the workpiece W, the oxidizing solution is mixed with hydrogen peroxide solution, pure water, or ozone water. As in the first embodiment, the nozzles 61a and 61b are movable so that the oxidizing solution and hydrogen peroxide solution, pure water, or ozone water uniformly cover the workpiece W, and the rotary table 62 with the workpiece W mounted thereon is rotated.

In step S5, organic materials or other contaminants on the workpiece W are peeled/removed by the oxidizability of the oxidizing solution. The peeled/removed contaminants are turned into a solution or semi-solution state, shattered by the centrifugal force from the rotating workpiece W, and adhered to the inner surface of the cover 29. The rotation speed of the rotary table 62 affects the peeling of the contaminants. Hence, cleaning can be efficiently performed by optimizing the rotation speed in accordance with the contamination situation.

Figure 10:
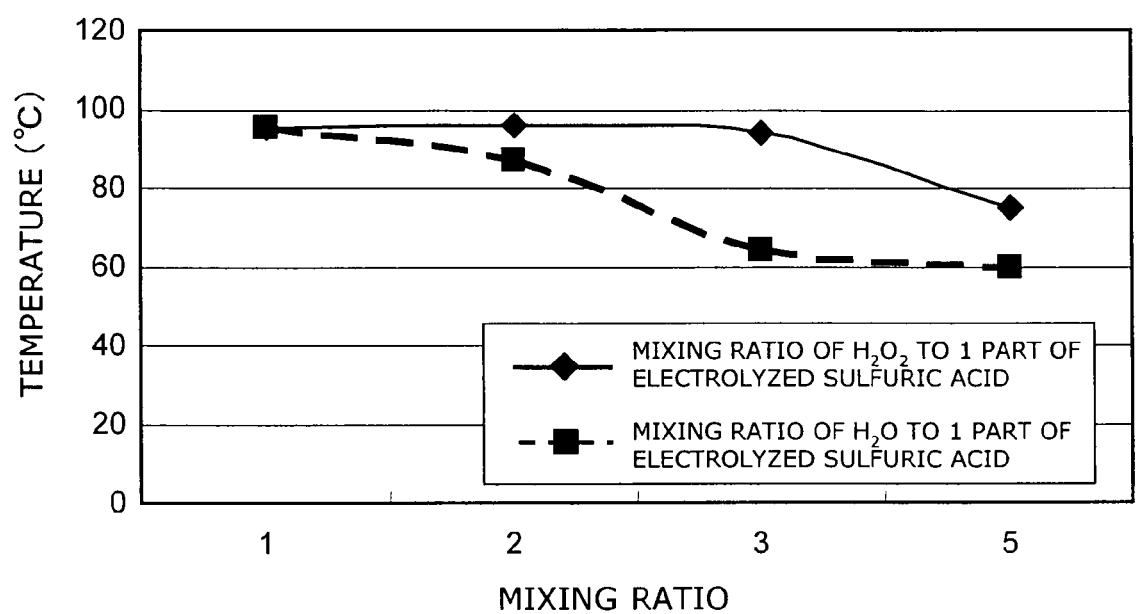
FIG. 10 is a graph showing temperature variation versus mixing ratio for the mixed solution of the oxidizing solution and hydrogen peroxide solution or pure water mixed on the workpiece W.

FIG. 10 is a graph showing temperature variation versus mixing ratio for the mixed solution of the oxidizing solution and hydrogen peroxide solution or pure water mixed on the workpiece W. Here again, the temperature was measured using a radiation thermometer for the oxidizing solution dripped from the nozzle 61a onto the workpiece W.

The temperatures of the oxidizing solution, pure water, and hydrogen peroxide solution before mixing were all set to room temperature. The temperature of the oxidizing solution increases by being mixed with pure water or hydrogen peroxide solution. However, comparing with the first embodiment where mixing is performed in the nozzle section 12, the temperature increase of the oxidizing solution due to heat of mixing is smaller, and the temperature of the oxidizing solution may decrease as a consequence of rotation of the workpiece W. Furthermore, the temperature may also conversely decrease depending on the mixing ratio. This is possibly because the temperature increase of the oxidizing solution due to heat of mixing requires a certain period of time after it is mixed with pure water or hydrogen peroxide solution.

Also in this embodiment, a cleaning experiment was performed by using the sample A, which was prepared by simply coating a silicon substrate with i-line resist to 3 microns, and the sample B, which was, after this resist coating, doped with boron at a dose amount of $6 \times 10^{14}/cm^2$ by ion implantation.

FIG. 11 shows a table summarizing the result of cleaning the evaluation sample A simply coated with resist in this embodiment.

Here, the table shows the maximum temperature (° C.) of the solution due to heat of mixing (heat of dilution) upon mixing pure water at room temperature in the oxidizing solution at room temperature. The time taken to peel the applied resist at that temperature is parenthesized. When the mixing ratio (volume ratio) of pure water to 1 part of the oxidizing solution at room temperature was increased to 1, 2, 3, and 5, the maximum temperature was 95° C., 87° C., 64° C., and 60° C. On the other hand, when the mixing ratio (volume ratio) of the oxidizing solution to 1 volume of pure water was increased to 1, 2, 3, and 5, the maximum temperature changed to 95° C., 96° C., 94° C., and 75° C. In both cases, the time taken to peel the resist was 5 seconds.

That is, also in this embodiment, it turns out that high cleanability is achieved under any of the conditions for the sample A simply coated with resist.

FIG. 12 shows a table of the result for the evaluation sample B in which the applied resist is ion-implanted with the above amount of boron.

When pure water was mixed, for a mixing ratio of 1:1, the resist was successfully peeled in 60 seconds. However, when the mixing ratio (volume ratio) of pure water was increased to 2, 3, and 5, the resist was difficult to peel in accordance with the decrease of the maximum temperature.

On the other hand, when hydrogen peroxide solution (35 percent concentration) was mixed with its volume ratio to 1 volume of the oxidizing solution being 1, 2, and 3, the maximum temperature was 95° C., 96° C., and 94° C. as also shown in FIG. 10, and the time taken to peel the resist was 60, 60, and 90 seconds. When the mixing ratio of hydrogen peroxide solution was 5, the maximum temperature was 75° C., and the ion-implanted resist was difficult to peel.

That is, also in this embodiment, it turns out that, when the temperature of the oxidizing solution after mixing is generally 95° C. or higher, a strong cleanability capable of peeling even an ion-implanted resist is achieved.

Next, a third embodiment of the invention is described.

Figure 13:
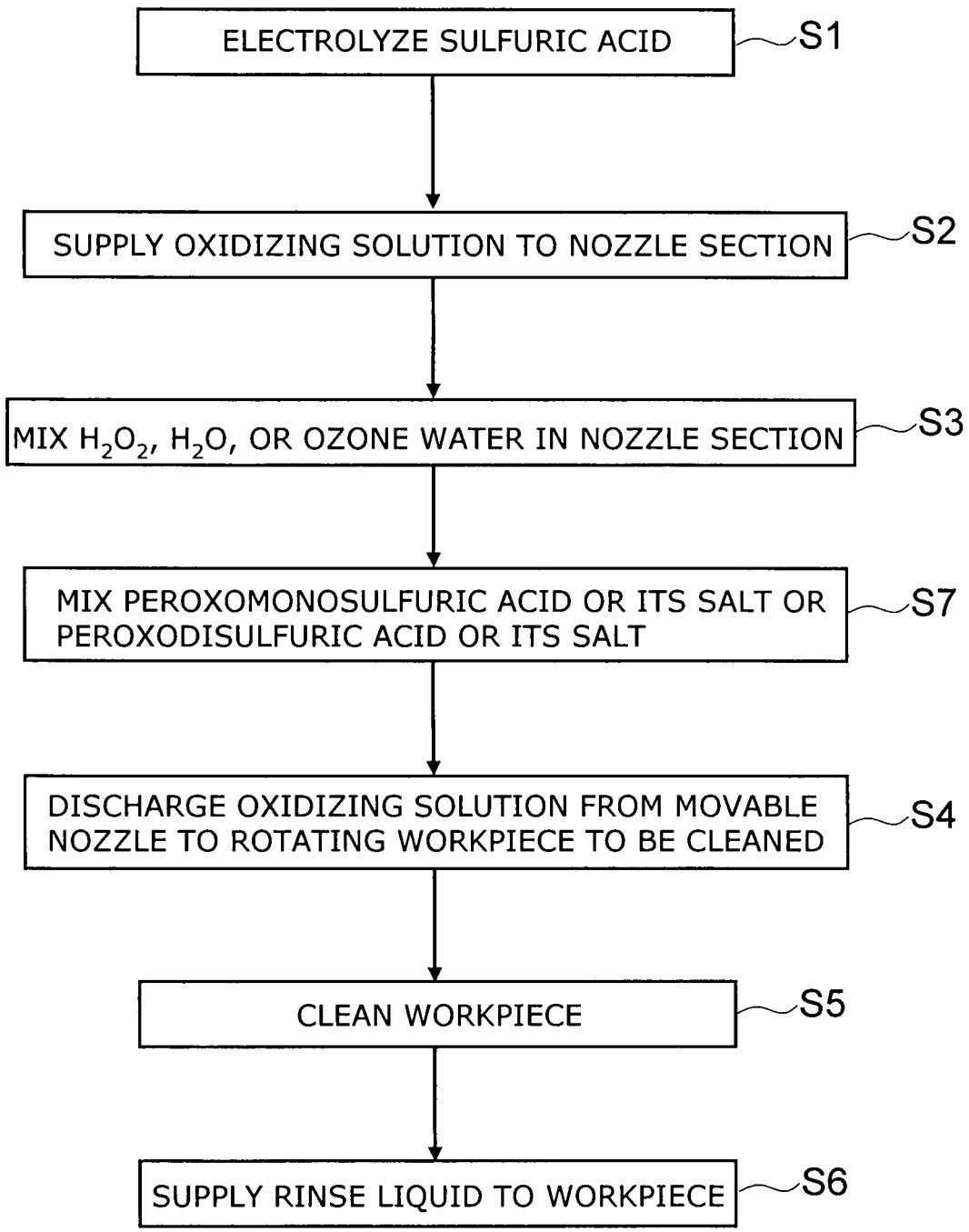
FIG. 13 is a flow chart illustrating a cleaning process in a cleaning method according to a third embodiment of the invention.

FIG. 13 is a flow chart illustrating a cleaning process in a cleaning method according to the third embodiment of the invention.

Figure 14:
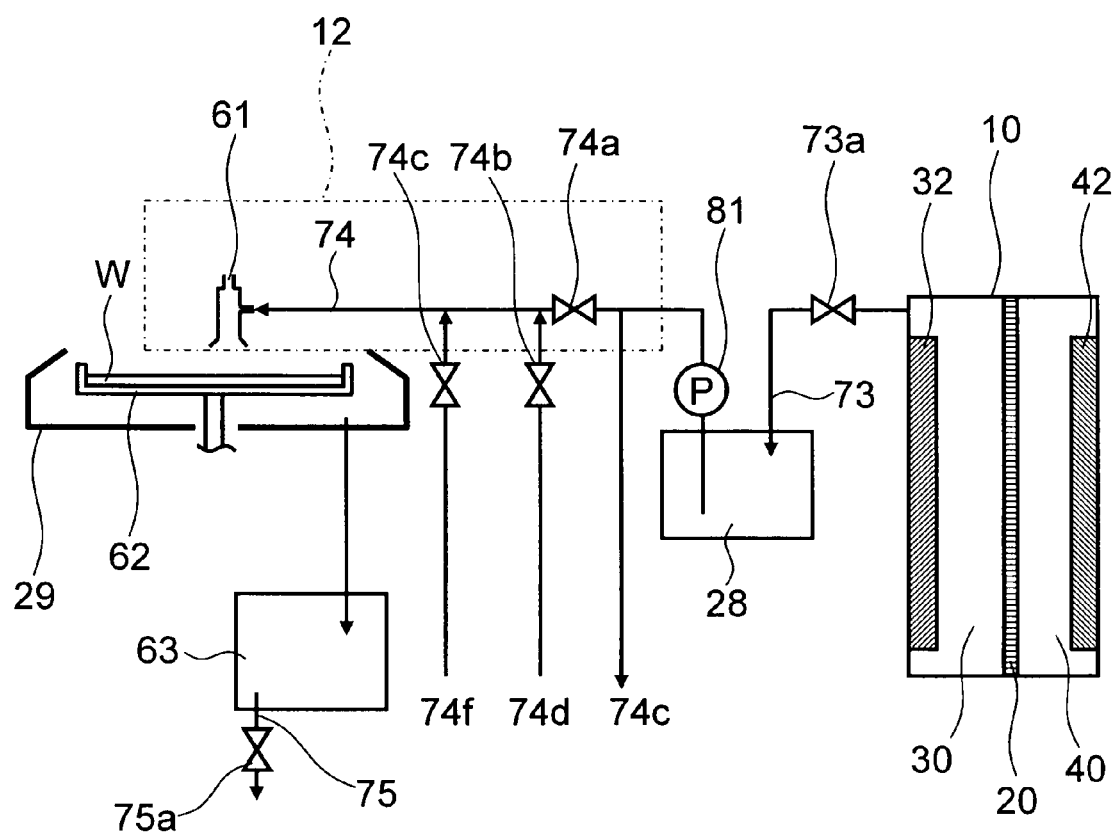
FIG. 14 is a schematic view illustrating a cleaning system that can be used in this embodiment.

FIG. 14 is a schematic view illustrating a cleaning system that can be used in this embodiment.

In this embodiment, hydrogen peroxide solution, pure water, or ozone water is mixed in an oxidizing solution obtained by electrolyzing concentrated sulfuric acid, and peroxomonosulfuric acid or its salt or peroxodisulfuric acid or its salt is further added thereto and mixed in the nozzle section 12.

The process from step S1 to step S2 is the same as that in the first embodiment. In step S3, hydrogen peroxide solution, pure water, or ozone water is supplied to the nozzle section 12 through a pipeline 74d and an open/close valve 74b.

In step S7, peroxomonosulfuric acid or its salt or peroxodisulfuric acid or its salt, or both of them, is further added to the nozzle section 12 through a pipeline 74f. The process of step S4 and later is the same as that in the first embodiment.

For example, if hydrogen peroxide solution is mixed in step S3 and ammonium peroxodisulfate solution is mixed in step S7, then a higher cleanability is achieved by the temperature increase of the oxidizing solution due to heat of reaction and the oxidizability of ammonium peroxodisulfate. That is, according to this embodiment, a cleaning liquid having stronger oxidizability can be produced by mixing peroxodisulfuric acid, its salt, or the like having strong oxidizability in addition to oxidizing substances produced by electrolysis of concentrated sulfuric acid. Consequently, a highly ion-implanted resist, for example, can be removed very rapidly.

Figure 15:
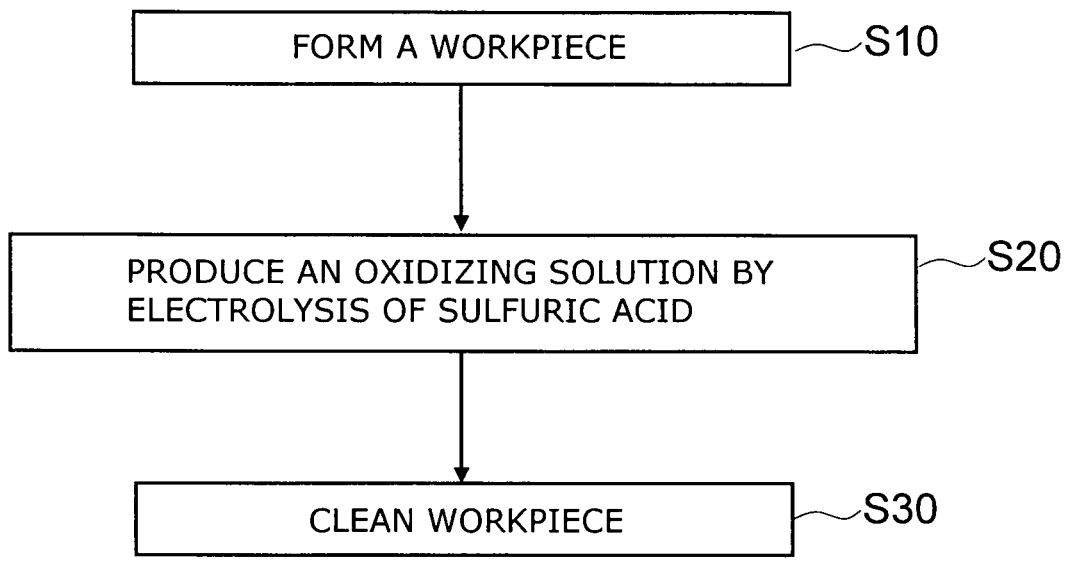
FIG. 15 is a flow chart illustrating a method for manufacturing an electronic device according to an embodiment of the invention.

FIG. 15 is a flow chart illustrating a method for manufacturing an electronic device according to an embodiment of the invention.

First, a workpiece is formed (step S10). For example, a semiconductor wafer to fabricate semiconductor devices or a glass substrate to fabricate flat panel displays such as liquid crystal displays can be formed as the workpiece. The workpiece may include resist layer to be removed by the following cleaning step on its surface.

Second, an oxidizing solution is produced by electrolysis of sulfuric acid (step S20). Specifically, the process as described with reference to step S1 shown in FIGS. 1, 3 and 13 may be employed in the producing process.

Then, the workpiece is cleaned (step S30). Specifically, steps S2 through S5 as shown in FIGS. 1, 8 or 13 may be employed in the cleaning process. A resist layer formed in a surface of the workpiece may be removed by the cleaning process (step S30). The workpiece may be rinsed afterward.

The embodiments of the invention have been described with reference to the examples. However, the invention is not limited to the above examples. For instance, the method for mixing the oxidizing solution with hydrogen peroxide solution, peroxomonosulfuric acid, or the like can be variously modified. Specifically, in the third embodiment, mixing of the oxidizing solution with peroxomonosulfuric acid or the like may be performed on the workpiece W rather than in the nozzle section 12.

Besides removing organic resist, the invention is also similarly applicable to removing metal impurities, removing particles, and removing dry etching residues.

Furthermore, the invention is applicable to manufacturing articles related to electronic devices (for example, semiconductor apparatuses and display elements) to which the above methods for cleaning impurities are applied.

The invention claimed is:
1. A cleaning method, comprising:
producing an oxidizing solution by electrolysis of sulfuric acid, the oxidizing solution including sulfuric acid and oxidizing substances, and the sulfuric acid having a concentration of 90% by mass or more;
generating heat of mixing by mixing the oxidizing solution with a hydrogen peroxide solution; and
cleaning a workpiece with the oxidizing solution which is heated by heat of mixing and is supplied while rotating the workpiece and discharging the oxidizing solution from a movable nozzle to the rotating workpiece, the mixing the oxidizing solution and the hydrogen peroxide solution being performed at one of in a nozzle section having the movable nozzle and on the workpiece, and a mixing ratio of the oxidizing solution to the hydrogen peroxide solution being in the range of 1:1 to 1:5.

2. The cleaning method according to claim 1, wherein the oxidizing solution includes at least one of peroxomonosulfuric acid and peroxodisulfuric acid.

3. The cleaning method according to claim 1, wherein the mixing and the generating the heat of mixing are performed before the oxidizing solution is brought into contact with the workpiece.

4. The cleaning method according to claim 3, wherein the mixing is performed in a nozzle which discharges the oxidizing solution to the workpiece.

5. The cleaning method according to claim 1, wherein the mixing and the generating the heat of mixing are performed after the oxidizing solution is brought into contact with the workpiece.

6. The cleaning method according to claim 1, wherein at least one selected from the group consisting of peroxomonosulfuric acid, a salt of peroxomonosulfuric acid, peroxodisulfuric acid, and a salt of peroxodisulfuric acid is added to the oxidizing solution.

7. The cleaning method according to claim 1, wherein an anode for the electrolysis is made of one selected from the group consisting of an insoluble anode, platinum, lead dioxide, and conductive diamond.

8. The cleaning method according to claim 1, wherein an anode for the electrolysis is made of conductive diamond.

9. The cleaning method according to claim 1, wherein a cathode for the electrolysis is made of one selected from the group consisting of an insoluble anode, platinum, carbon, and conductive diamond.

10. The cleaning method according to claim 1, wherein the oxidizing solution is heated before the mixing.

11. The cleaning method according to claim 1, wherein the oxidizing solution is brought into contact with the workpiece while moving a nozzle which discharges the oxidizing solution.

12. The cleaning method according to claim 1, wherein the oxidizing solution is brought into contact with the workpiece while rotating a table on which the workpiece is mounted.

13. A method for manufacturing an electronic device, comprising:

forming a workpiece;

producing an oxidizing solution by electrolysis of sulfuric acid, the oxidizing solution including sulfuric acid and oxidizing substances, and the sulfuric acid having a concentration of 90% by mass or more;

generating heat of mixing by mixing the oxidizing solution with a hydrogen peroxide solution; and cleaning the workpiece with the oxidizing solution which is heated by heat of mixing and is supplied while rotating the workpiece and discharging the oxidizing solution from a movable nozzle to the rotating workpiece, the mixing the oxidizing solution and the hydrogen peroxide solution being performed at one of in a nozzle section having the movable nozzle and on the workpiece, and a mixing ratio of the oxidizing solution to the hydrogen peroxide solution being in the range of 1:1 to 1:5.

14. The method for manufacturing an electronic device according to claim 13, wherein the workpiece includes an ion-implanted resist.

15. The method for manufacturing an electronic device according to claim 14, wherein the resist is peeled by heating the oxidizing solution to 95° C. or higher.

16. The method for manufacturing an electronic device according to claim 14, wherein the oxidizing solution is heated to 125° C. or higher.

17. The method for manufacturing an electronic device according to claim 14, wherein the resist is peeled by the oxidizing solution which includes the hydrogen peroxide solution with its volume ratio to 1 volume of the oxidizing solution being from 1 to 5.

* * * * *